US012582014B2

(12) United States Patent
Hsu et al.

(10) Patent No.: US 12,582,014 B2
(45) Date of Patent: Mar. 17, 2026

(54) SEMICONDUCTOR DEVICE ASSEMBLY SUBSTRATES WITH TUNNELED INTERCONNECTS, AND METHODS FOR MAKING THE SAME

(71) Applicant: Micron Technology, Inc., Boise, ID (US)

(72) Inventors: Yun Ting Hsu, Taichung (TW); Chong Leong Gan, Taichung (TW); Min Hua Chung, Taichung (TW); Yung Sheng Zou, Taichung (TW)

(73) Assignee: Micron Technology, Inc., Boise, ID (US)

( * ) Notice: Subject to any disclaimer, the term of this patent is extended or adjusted under 35 U.S.C. 154(b) by 697 days.

(21) Appl. No.: 17/893,968

(22) Filed: Aug. 23, 2022

(65) Prior Publication Data

US 2024/0071963 A1     Feb. 29, 2024

(51) Int. Cl.
*H01L 23/00* (2006.01)
*H01L 23/498* (2006.01)

(52) U.S. Cl.
CPC ........ *H01L 24/05* (2013.01); *H01L 23/49811* (2013.01); *H01L 23/49838* (2013.01);
(Continued)

(58) Field of Classification Search
CPC ... H01L 24/27; H01L 24/83; H01L 23/49866; H01L 21/4846; H01L 23/49838; H01L 23/49811; H01L 24/16; H01L 24/05; H01L 24/32; H01L 24/92; H01L 24/81; H01L 24/75; H01L 24/73; H01L 2224/32227; H01L 2924/1438; H01L 2224/05551; H01L 2224/32058; H01L 2224/32059; H01L 2224/05647; H01L 2224/83815; H01L 2224/05553; H01L 2224/32238; H01L 2224/3207; H01L 2224/05557; H01L 2224/2732; H01L 2224/32014; H01L 2924/1436; H01L 2924/1431; H01L 2224/75252; H01L 2924/00012; H01L 2224/131; H01L 2924/014; H01L 2924/00014; H01L 2224/81203; H01L 2224/83203; H01L 2224/7531; H01L 2224/73104; H01L 2224/9211;
(Continued)

(56) References Cited

U.S. PATENT DOCUMENTS 5,341,564 A * 8/1994 Akhavain ............... H01L 24/81
257/E21.511
6,200,143 B1 * 3/2001 Haba ...................... H01R 12/89
439/70
(Continued)

*Primary Examiner* — Mouloucoulaye Inoussa
(74) *Attorney, Agent, or Firm* — Dorsey & Whitney LLP

(57) ABSTRACT

A semiconductor device assembly is provided. The assembly includes a package substrate which has a tunneled interconnect structure. The tunneled interconnect structure has a solder-wettable surface, an interior cavity, and at least one microvia extending from the surface to the cavity. The assembly further includes a semiconductor device disposed over the substrate and a solder joint coupling the device and the substrate. The joint comprises the solder between the semiconductor device and the interconnect structure, which includes the solder on the surface, the solder in the microvia, and the solder within the interior cavity.

12 Claims, 14 Drawing Sheets

(52) U.S. Cl.
CPC ........ *H01L 23/49866* (2013.01); *H01L 24/27* (2013.01); *H01L 24/32* (2013.01); *H01L 24/83* (2013.01); *H01L 2224/05551* (2013.01); *H01L 2224/05553* (2013.01); *H01L 2224/05557* (2013.01); *H01L 2224/05647* (2013.01); *H01L 2224/2732* (2013.01); *H01L 2224/32014* (2013.01); *H01L 2224/32058* (2013.01); *H01L 2224/32059* (2013.01); *H01L 2224/3207* (2013.01); *H01L 2224/32227* (2013.01); *H01L 2224/32238* (2013.01); *H01L 2224/83815* (2013.01); *H01L 2924/1431* (2013.01); *H01L 2924/1436* (2013.01); *H01L 2924/1438* (2013.01)

(58) Field of Classification Search
CPC . H01L 2224/75303; H01L 2224/81815; H01L 2224/75502; H05K 3/3442; H05K 1/111; H05K 2201/09472
See application file for complete search history.

(56) References Cited

U.S. PATENT DOCUMENTS

| | | | | |
|---|---|---|---|---|
| 6,872,591 | B1 * | 3/2005 | Wang | H01L 24/82 |
| | | | | 438/106 |
| 2005/0266674 | A1 * | 12/2005 | Huang | H05K 3/1225 |
| | | | | 257/E23.021 |
| 2006/0027728 | A1 * | 2/2006 | Akram | H01L 24/11 |
| | | | | 249/115 |
| 2007/0251089 | A1 * | 11/2007 | Kawamura | B23K 3/0623 |
| | | | | 29/874 |
| 2008/0022870 | A1 * | 1/2008 | Stamme | B41F 31/027 |
| | | | | 101/129 |
| 2009/0159651 | A1 * | 6/2009 | Sunohara | H05K 3/3478 |
| | | | | 228/41 |
| 2014/0110462 | A1 * | 4/2014 | Gruber | B23K 1/0008 |
| | | | | 228/41 |
| 2020/0027855 | A1 * | 1/2020 | Lee | H01L 24/75 |
| 2021/0398935 | A1 * | 12/2021 | Kim | H01L 24/92 |
| 2022/0415773 | A1 * | 12/2022 | Lin | H01L 21/4853 |
| 2023/0217593 | A1 * | 7/2023 | Nam | H01L 23/49827 |
| | | | | 361/761 |
| 2023/0266674 | A1 * | 8/2023 | Sugawara | G03F 7/704 |
| | | | | 219/121.82 |
| 2025/0096087 | A1 * | 3/2025 | Yasukawa | H01L 24/14 |

* cited by examiner

SEMICONDUCTOR DEVICE ASSEMBLY SUBSTRATES WITH TUNNELED INTERCONNECTS, AND METHODS FOR MAKING THE SAME

TECHNICAL FIELD

The present disclosure generally relates to semiconductor device assemblies, and more particularly relates to semiconductor device assembly substrates with tunneled interconnects, and methods for making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIGS. 22-24 show a method of making the structure of the tunneled interconnect structure in accordance with embodiments of the present technology.

DETAILED DESCRIPTION

The electronics industry relies upon continuous innovation in the field of semiconductor packaging to meet the global need for higher-functioning technology. One such innovation is Surface Mounted Technology (SMT). SMT minimizes manufacturing costs and makes more efficient use of the space on a Printed Circuit Board (PCB) or a package substrate by obviating the need to drill holes through a PCB or a package substrate and allowing for more components to attach to the surface of a board.

Figure 1:
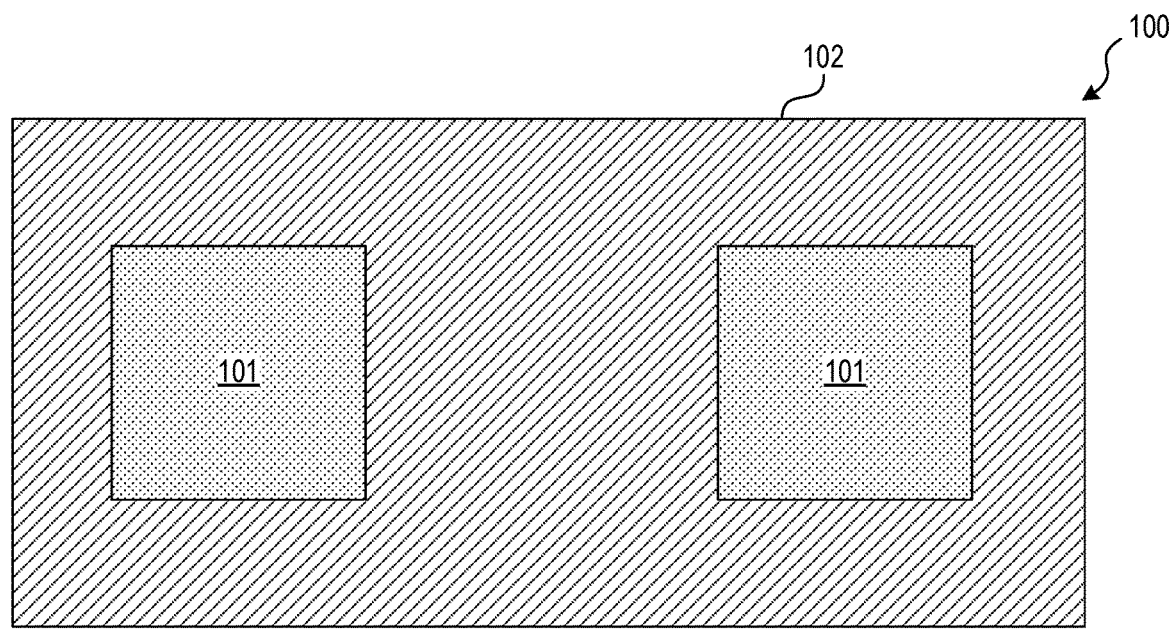
FIG. 1 is a simplified partial schematic plan view of a substrate for a semiconductor device assembly.
Figure 3:
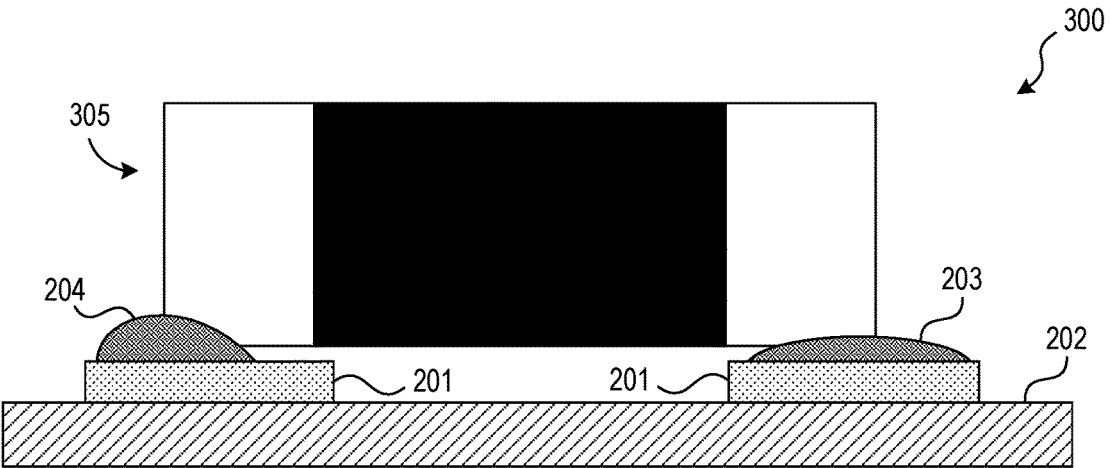
Figure 4:
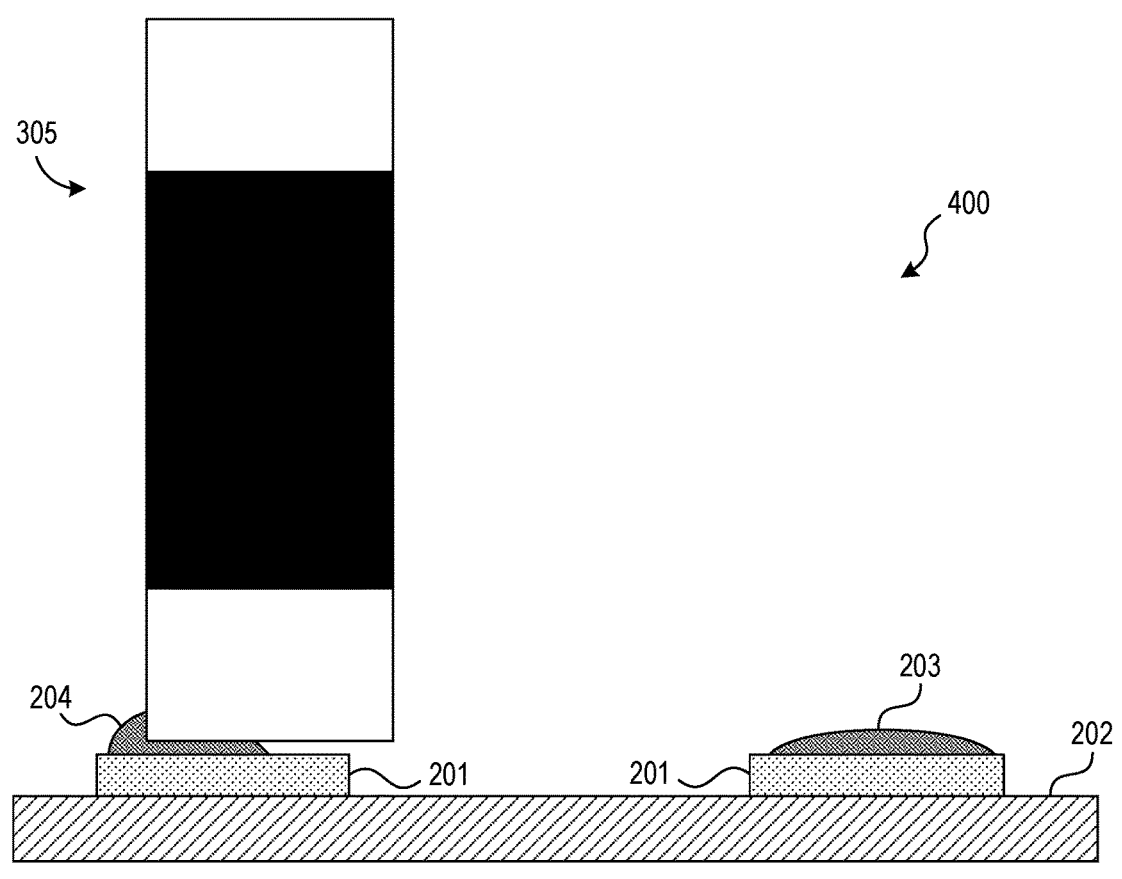

FIG. 1 is a simplified partial schematic plan view of such a substrate 100, whose benefits (e.g., in component density and manufacturing costs, etc.) are enabled by an exposed metal "pad" 101 on the surface of a printed circuit board 102. This arrangement eliminates the need for long metal leads that would have otherwise bonded an electronic component to the board 102, and instead replaces them with smaller leads, or no leads at all. By eliminating long leads to interconnect a semiconductor device to a board, SMT allows for a reduction in the size of both the board and the electronic components being attached to the board. However, this also means that SMT can lead to more fragile connections between components and the board. This fragility is illustrated in FIGS. 2 through 4.

Figure 2:
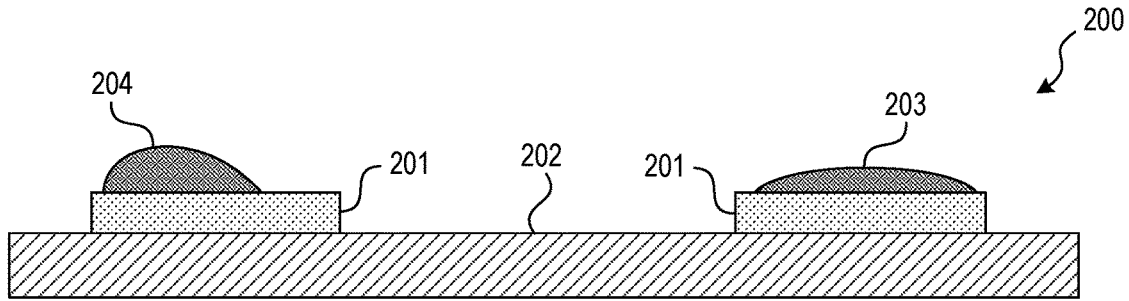
FIGS. 2-4 are simplified partial schematic cross-sectional views of a substrate for a semiconductor device assembly.

FIG. 2 shows a pad 201 with a metal solder which has been applied: the metal solder includes a solder defect 204 (e.g., mis-applied solder) and a mound of regular solder 203 on adjacent pads 201. This is a frequent problem in SMT. When a component 305 is disposed atop the solder defect 204 as well as the mound of regular solder 203, as shown in FIG. 3, the reflow operation can cause the solder defect 204 to creep up the side of the component 305 and pull it off of its adjoining pad 201. FIG. 4 demonstrates the effect of the defected solder 204 exerting an uneven pull on its side of the component 305 (e.g., due to entering a liquid state faster, creeping further up the side of the component, etc.), resulting in the component 305 breaking contact with a board 202.

Embodiments of the present disclosure solve the foregoing challenges and others by providing tunneled semiconductor interconnects that include one or more microvias and a hollow interior accessible through the microvias to facilitate even solder distribution and inhibit solder defects.

Figure 5:
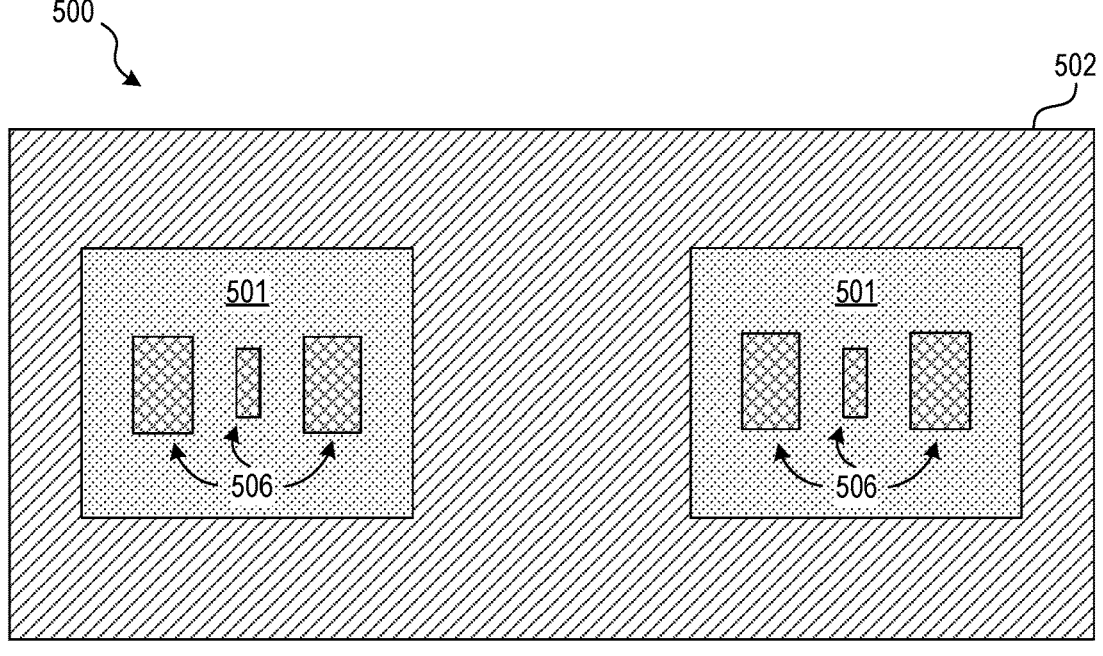
FIG. 5 is a simplified partial schematic plan view of a substrate for a semiconductor device assembly in accordance with embodiments of the present technology.

FIG. 5 is a simplified schematic plan view of a semiconductor device assembly 500 in accordance with embodiments of the present technology. The assembly includes a board 502 with a tunneled interconnect 501 that possesses a hollow interior that is accessible through one or more microvias 506.

Figure 6:
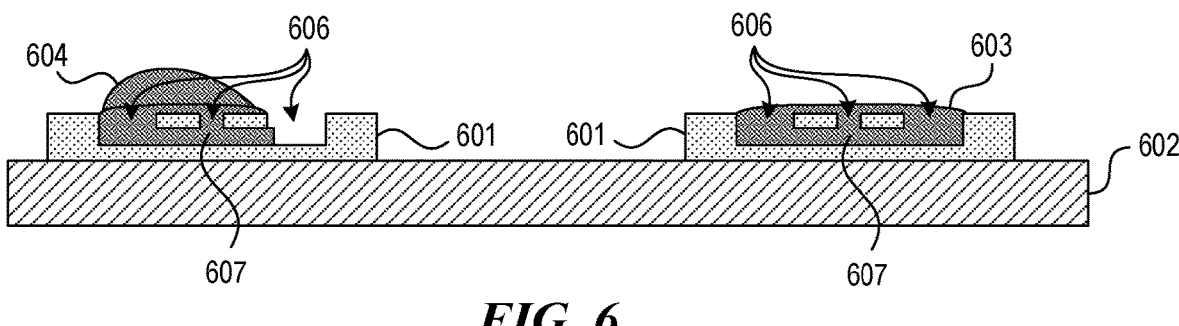
FIG. 6 is a simplified schematic cross-sectional view of a semiconductor device assembly in accordance with embodiments of the present technology.

In FIG. 6 a hollow interior 607 within a tunneled interconnect 601 is made visible in a simplified schematic cross-sectional view of an assembly 600. In this view, a regular mound of solder paste 603 has been applied to the interconnect 601, and a defective solder 604 has been applied to an adjacent tunneled interconnect 601. Due to the design of the tunneled interconnect 60, the defective solder paste 604 has left a gap within its hollow interior 607.

Figure 7:
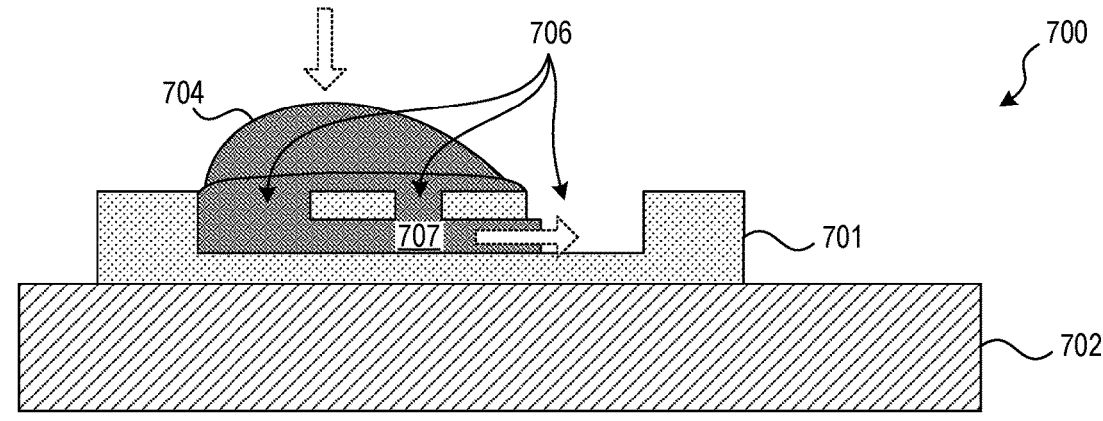
FIG. 7 is a simplified schematic cross-sectional detail view of a semiconductor device assembly in accordance with embodiments of the present technology.

This gap becomes significant once the defective solder 604 is heated and enters a liquid state. FIG. 7 demonstrates that is disposed (e.g., by an SMT printer, by a technician, etc.) atop a liquid mound of defective solder 704 on a tunneled interconnect 701. Pressure from onto the defective solder 704 causes that solder 704 to redistribute (the direction of these forces illustrated in FIG. 7 by the dashed arrows), given microvias 706 and a hollow interior 707 providing a path for the solder 704 to redistribute through the inside of the tunneled interconnect 701. In this way, the application of forces the unevenly distributed solder 704 back down into the hollow interior 707 of the interconnect 701 and up and out a microvia 706 that is unfilled, thereby evenly distributing the solder 704 rather than allowing the solder 704 to creep up the side, a fault which can lead to defects, as illustrated in FIGS. 3 and 4.

Figure 8:
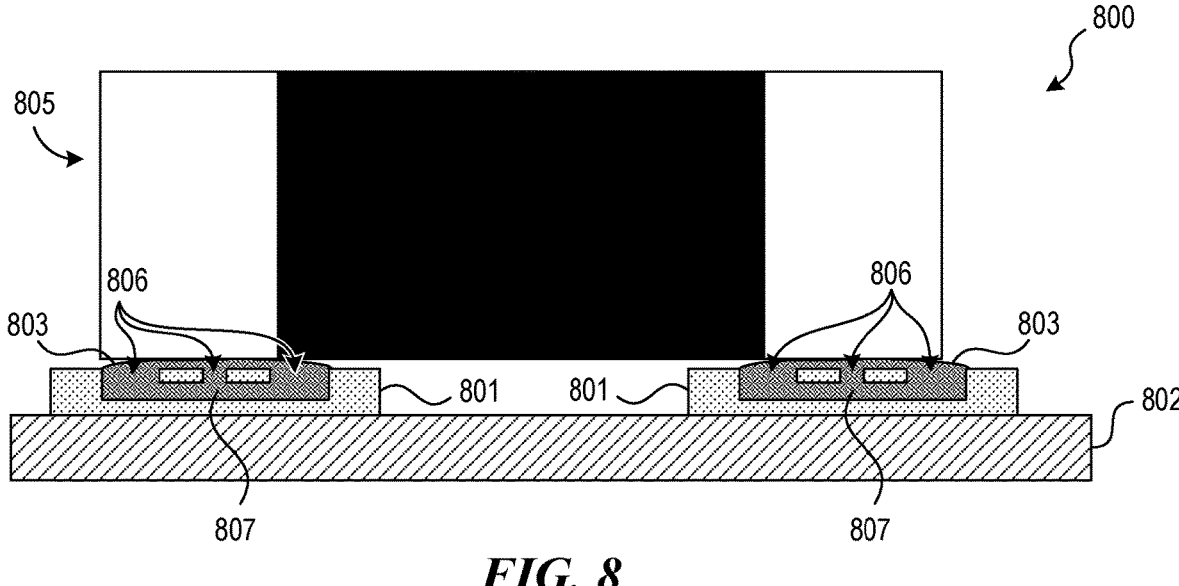
FIG. 8 is a simplified schematic cross-sectional view of a semiconductor device assembly in accordance with embodiments of the present technology.

The end result of this process is illustrated by FIG. 8, wherein the semiconductor device assembly 800 has a component 805 attached to a tunneled interconnect 801 via a solder paste 803. This solder 803 is evenly bonded to the component 805 thanks to microvias 806 and a hollow interior 807 within the interconnect 801, which allows the solder 803 to flow through the tunneled interconnect 801 during a heating and liquifying process, explained in FIG. 7.

Figure 9:
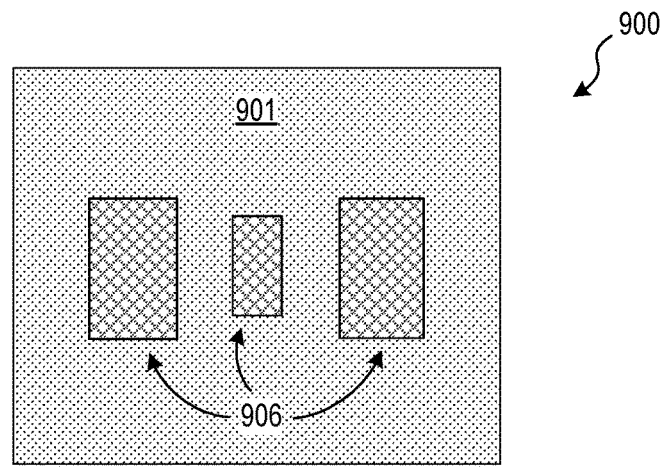
FIG. 9 is a simplified schematic plan view of a tunneled interconnect structure of a substrate for a semiconductor device assembly in accordance with embodiments of the present technology.

FIG. 9 depicts a simplified schematic plan view of a tunneled semiconductor interconnect 901 in accordance with embodiments of the present disclosure. The interconnect 901 may be square in shape, as illustrated in the Figure, or possessing some other shape. The interconnect 901 has a plurality of microvias 906 in its surface. The microvias 906 can include one smaller microvia positioned in the center of the interconnect 901, with two larger microvias on either side. These microvias can be rectangular in shape. Additionally, these microvias can vary from the Figure. Their size, shape, number, arrangement, and relative orientation are limited only by the size of the interconnect 901.

Figure 10:
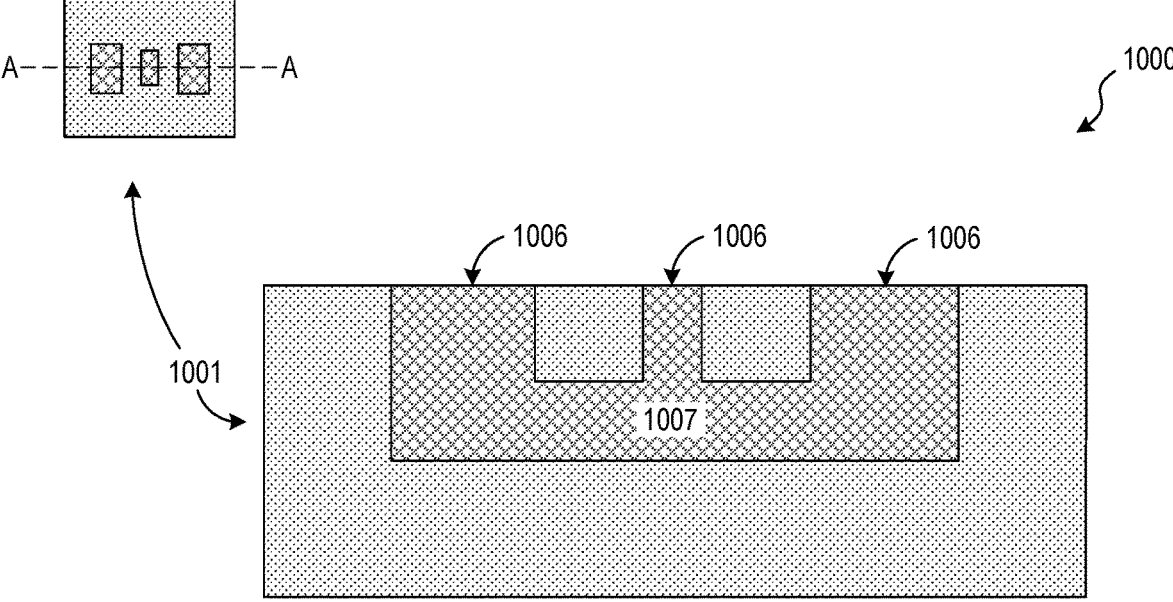
FIG. 10 is a simplified schematic cross-sectional view of a tunneled interconnect structure of a substrate for a semiconductor device assembly in accordance with embodiments of the present technology.

FIG. 10 illustrates a cross-section of a tunneled semiconductor interconnect 1001 taken along a line A-A. According to this view, a plurality of microvias 1006 are shown as being connected by a hollow interior 1007 within the interconnect 1001. The edges of the hollow interior can be straight, as illustrated in the Figure, or curved. The microvias 1006 may extend almost to the bottom of the interconnect 1001 before reaching the hollow interior 1007, or the hollow interior 1007 may lie just below the top surface of the interconnect 1001. Additionally, the hollow interior 1007 can vary in depth (as measured from top to bottom), being just deep enough to permit the flow of solder, to almost as deep as the height of the interconnect 1001 itself, leaving only just enough room for the top and bottom surfaces. The shape of the regions above the hollow interior 1007 and between the microvias 1006 may be square in shape, as illustrated, or semi-circular, or some other shape.

Figure 11:
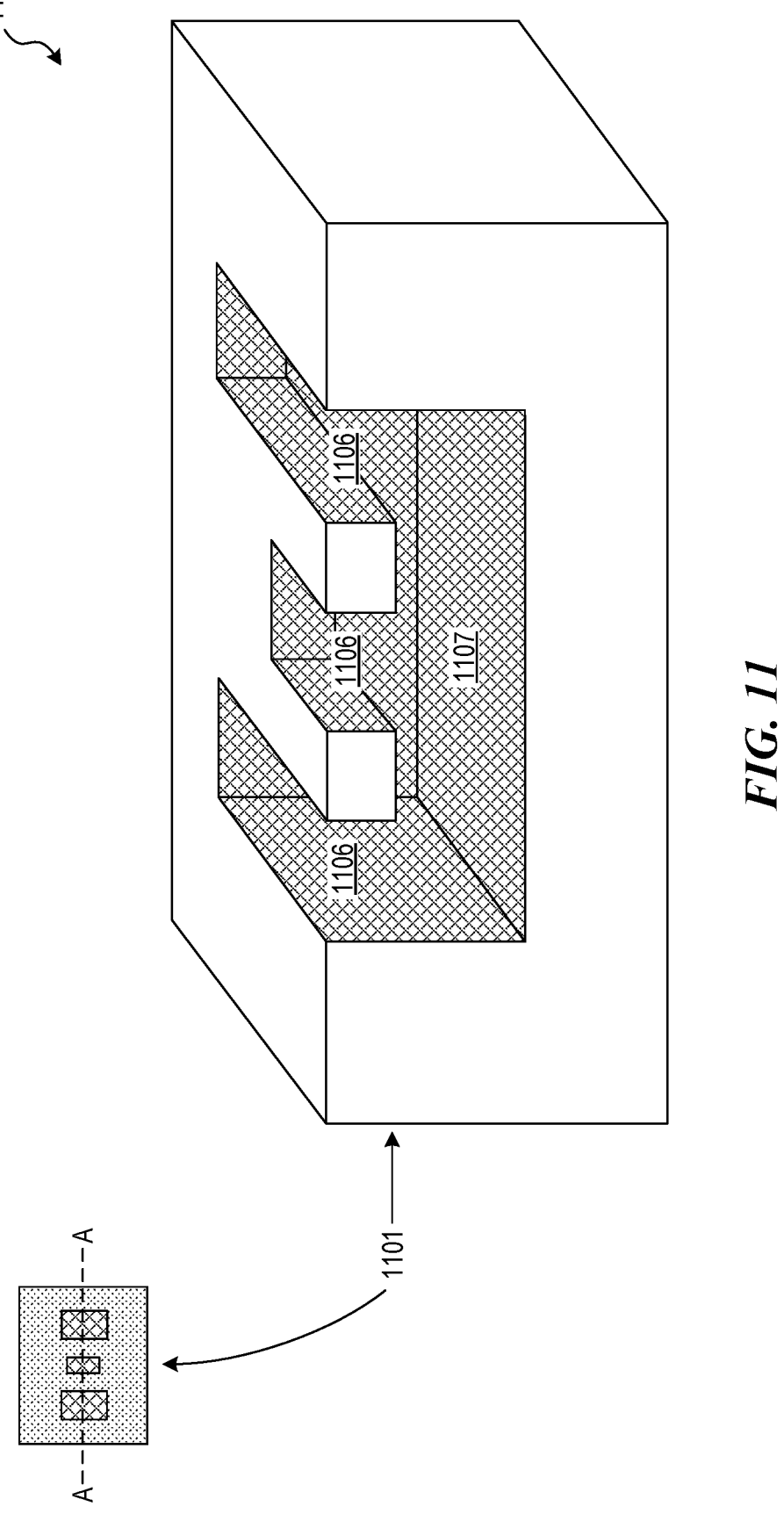
FIG. 11 is a simplified schematic oblique cross-sectional view of a tunneled interconnect structure of a substrate for a semiconductor device assembly in accordance with embodiments of the present technology.

FIG. 11 is a cross-sectional oblique view of a tunneled semiconductor interconnect 1101 taken along the same line A-A, sliced in the same fashion as FIG. 10, but with the interconnect 1101 angled to allow a view of the depth (as measured from front to back) of a hollow interior 1107 and a plurality of microvias 1106. As illustrated, the depth of the longer microvias 1106 matches the depth of the hollow interior 1107. This does not need to be the case. The hollow interior 1107 can extend further than the microvias 1106, or the microvias 1106 can extend closer to the front and back sidewall of the interconnect 1101.

Figure 12:
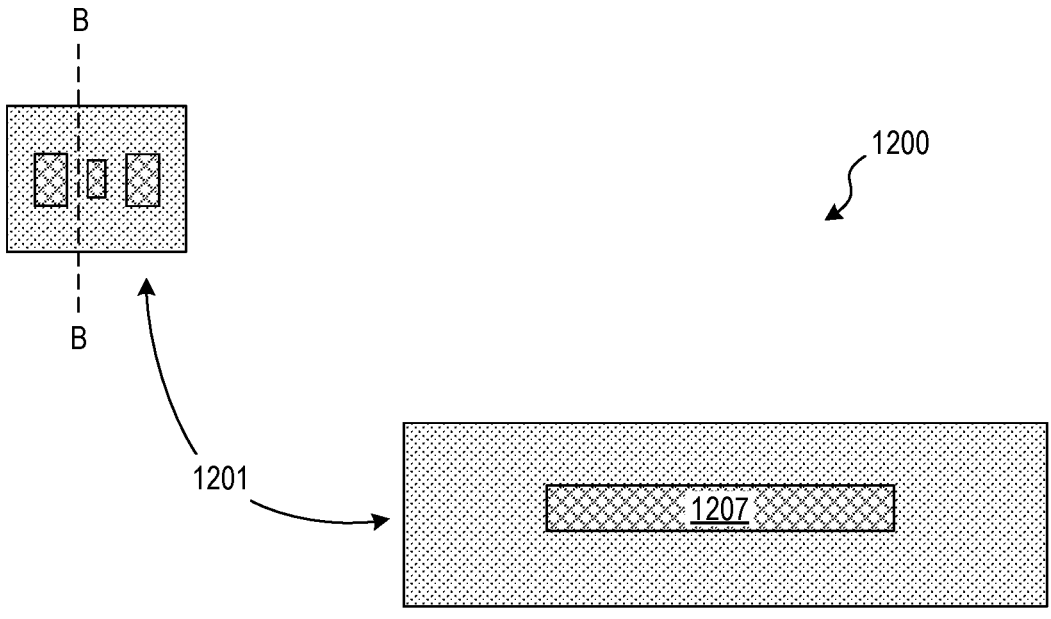
FIGS. 12-14 are simplified schematic cross-sectional views of a tunneled interconnect structure of a substrate for a semiconductor device assembly in accordance with embodiments of the present technology.

FIG. 12 is a cross-sectional view of a tunneled semiconductor interconnect 1201 taken along a line B-B. This is to illustrate a hollow interior 1207 contained within the interconnect 1201, highlighting the capacity of the hollow interior 1207 to serve as a "tunnel" between a plurality of microvias from foregoing Figures. If a solder were unevenly distributed so that one microvia had an excess of solder while another microvia was largely free from solder, and there was downward pressure from a component forcing the excess solder down into the interconnect 1201, the hollow interior 1207 would enable that excess solder to flow from the full microvia to the empty one. The hollow interior 1207 can be rectangular, circular, ovoid, or some other shape, and extend as far in any direction within the interconnect 1201 such that the hollow 1207 does not open an outward hole in any side or surface.

Figure 13:
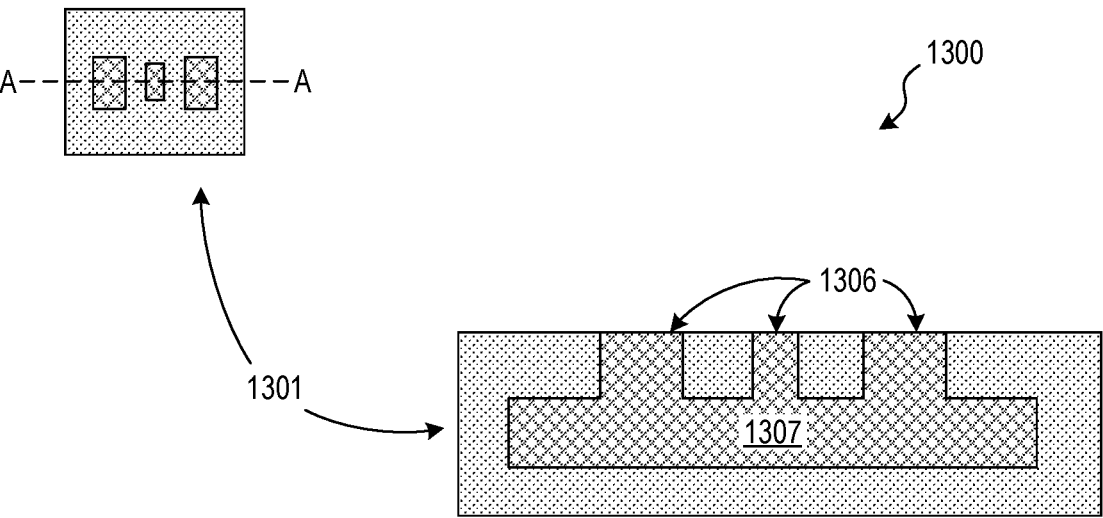

In the foregoing Figures, the embodiments have illustrated a hollow interior that spans the width of the microvias. FIG. 13 shows that this does not need to be the case, demonstrating a hollow interior 1307 that spans a width greater than the width of a plurality of microvias 1306 above it, from a cross-sectional view of an interconnect 1301 taken along a line A-A.

Figure 14:
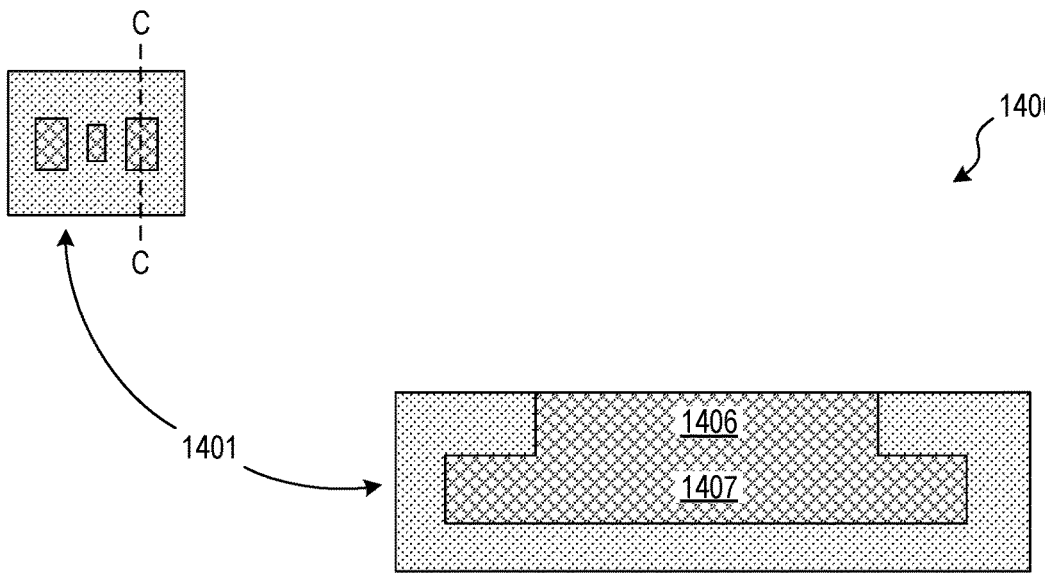

Likewise, FIG. 14 shows an interconnect 1400 can have a hollow interior 1407 that spans a greater length than a plurality of microvias 1406 on the surface above it, from a cross-sectional view of an interconnect 1401 taken along a line C-C.

Figure 15:
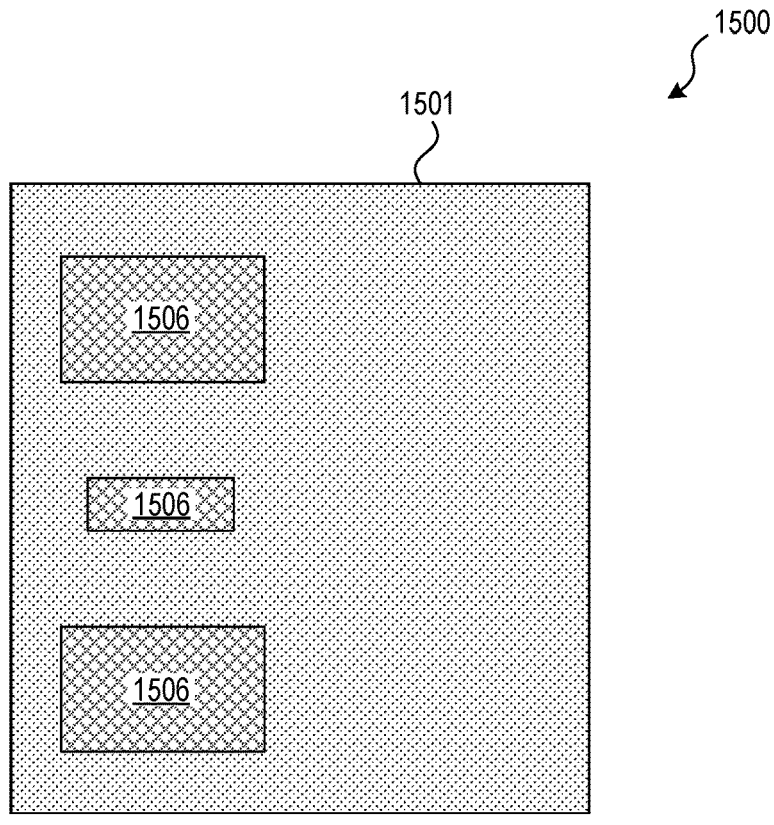
FIGS. 15-19 are simplified schematic plan views of a tunneled interconnect structure of a substrate for a semiconductor device assembly in accordance with embodiments of the present technology.

In the foregoing embodiments, the microvias have been depicted as spanning the width of the interconnect, positioned across the middle. FIG. 15 depicts an alternate embodiment in which a plurality of microvias 1506 run down the length of an interconnect 1501. These microvias 1506 are positioned off-center and closer to one side.

Figure 16:
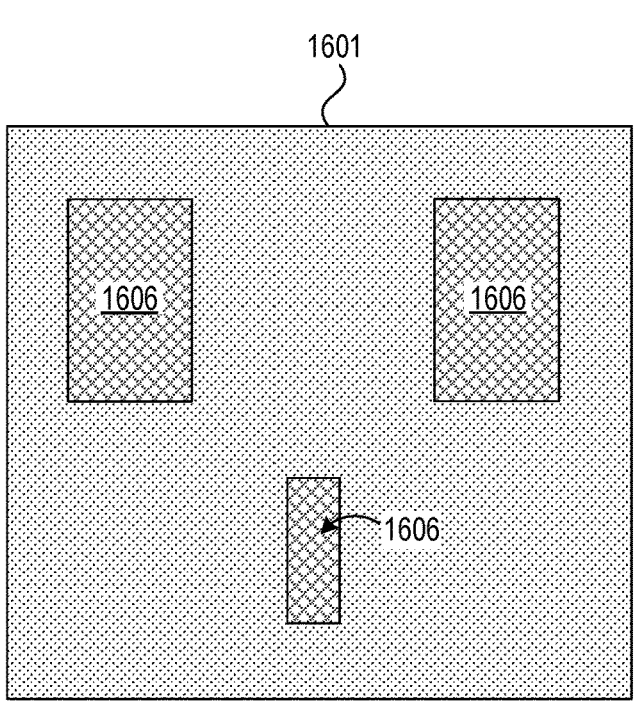

The microvias do not need to be in alignment. FIG. 16 shows an alternate embodiment in which a plurality of microvias 1606 occupies opposite ends of an interconnect 1601. Specifically, a smaller central microvia is out of alignment with two larger microvias that are positioned on either side, and set back, from the smaller microvia.

Figure 17:
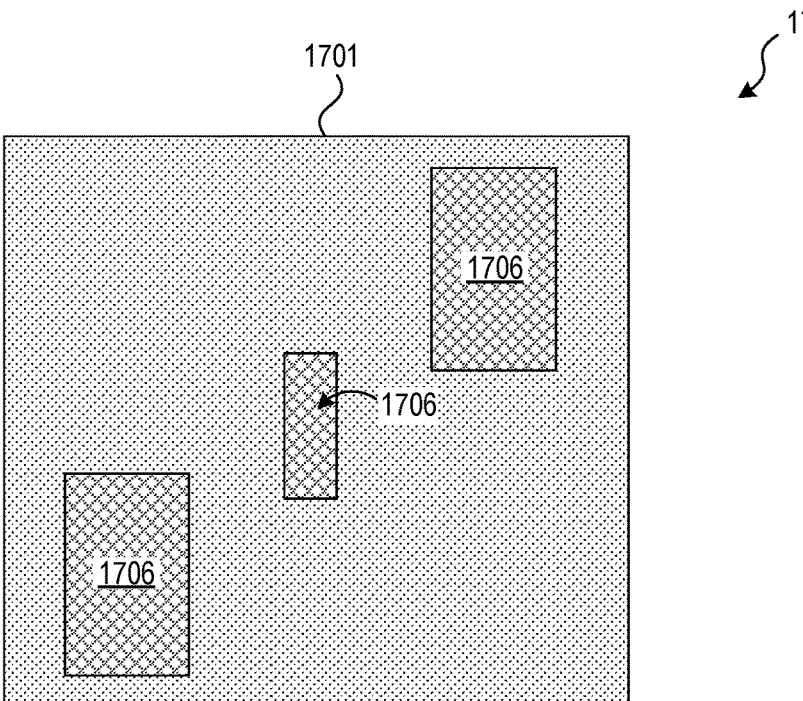

Taking this idea one step further, FIG. 17 illustrates an embodiment in which a plurality of microvias 1706 are aligned on a diagonal.

Figure 18:
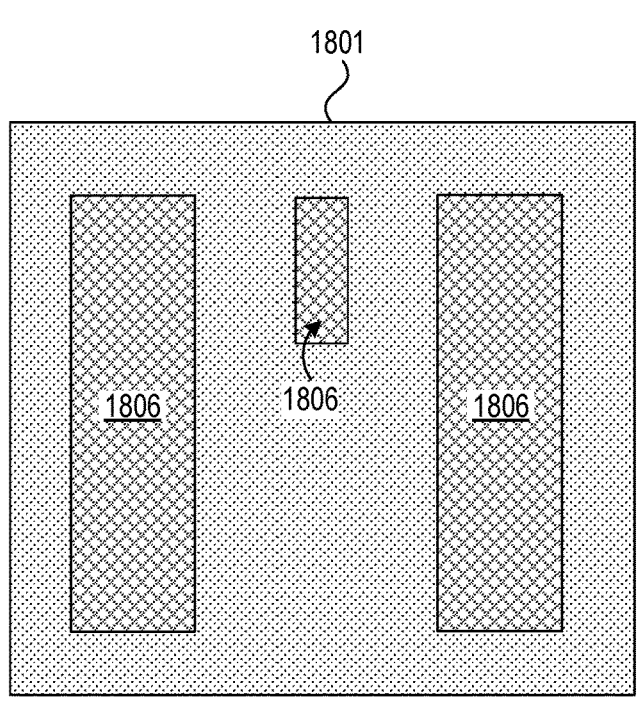

In SMT, there are various stencil designs that can be used when applying solder to pads. FIG. 18 is an illustration of an interconnect 1801 which can possess microvias 1806 to match an "Inverted Homeplate" stencil aperture. In this aperture design, the aperture comes to a point in order to limit the amount of solder deposited on the middle of the interconnect 1801, and thereby reduce the likelihood of the solder forming a ball under the middle of the component and thereby adversely affect electrical reliability. This aperture design can also be referred to as "Radiused Inverted Home Plate," or "Inverted Homeplate."

Figure 19:
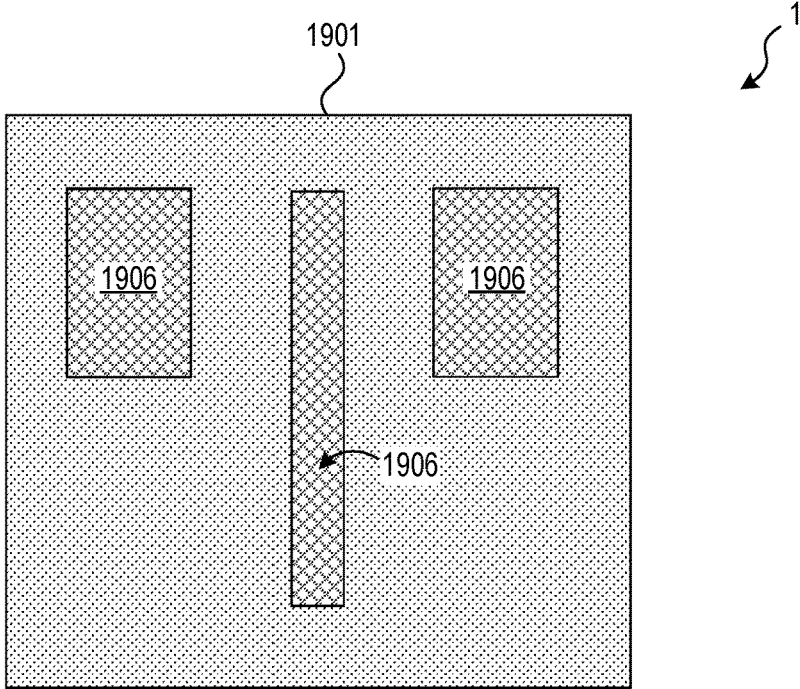

On the other hand, FIG. 19 depicts an interconnect 1901 with a plurality of microvias 1906 whose shape and placement are designed to match a "Homeplate" stencil aperture. Here, the aperture comes to a point on the outer part of the interconnect 1901 is reduced, thereby lowering the likelihood that solder will creep up the sides of the component and cause tombstoning. This aperture design can also be referred to as "inverted U-shape" or "radiused Homeplate."

Figure 20:
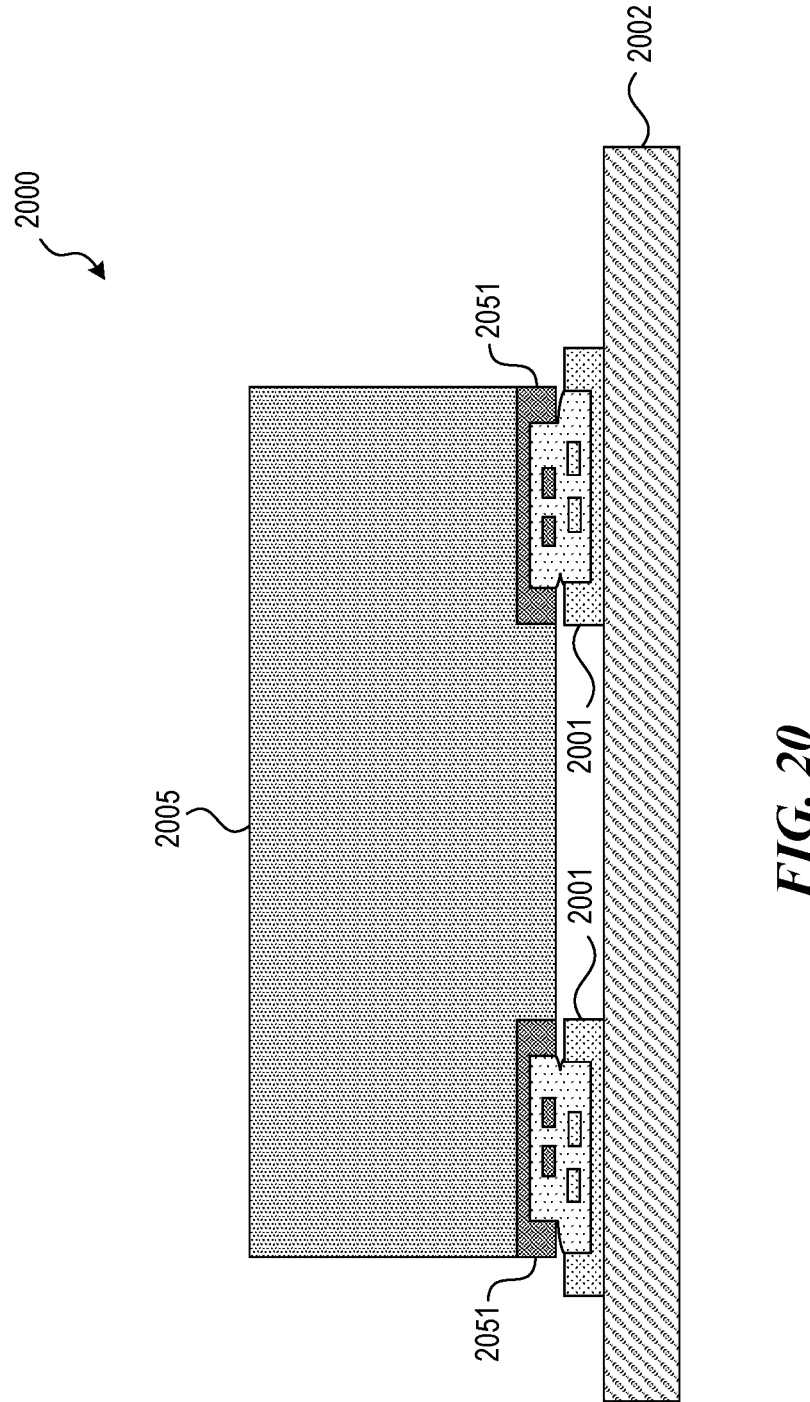
FIG. 20 is a simplified schematic cross-sectional view of a semiconductor assembly in accordance with embodiments of the present technology.

FIG. 20 further extrapolates the concept of a tunneled semiconductor interconnect structure. This Figure shows the tunneled interconnect not only as a technical feature belonging to a substrate, 2002, but also as a technical feature of a semiconductor device (e.g., a die, an interposer, etc.) as well, 2005. Assembly 2000 portrays the device's interconnect 2051 as a leadless contact. The tunneled design of these interconnects 2051 can assist in the even distribution of solder as they are paired with a matching interconnect structure in the attached substrate, 2001.

Figure 21:
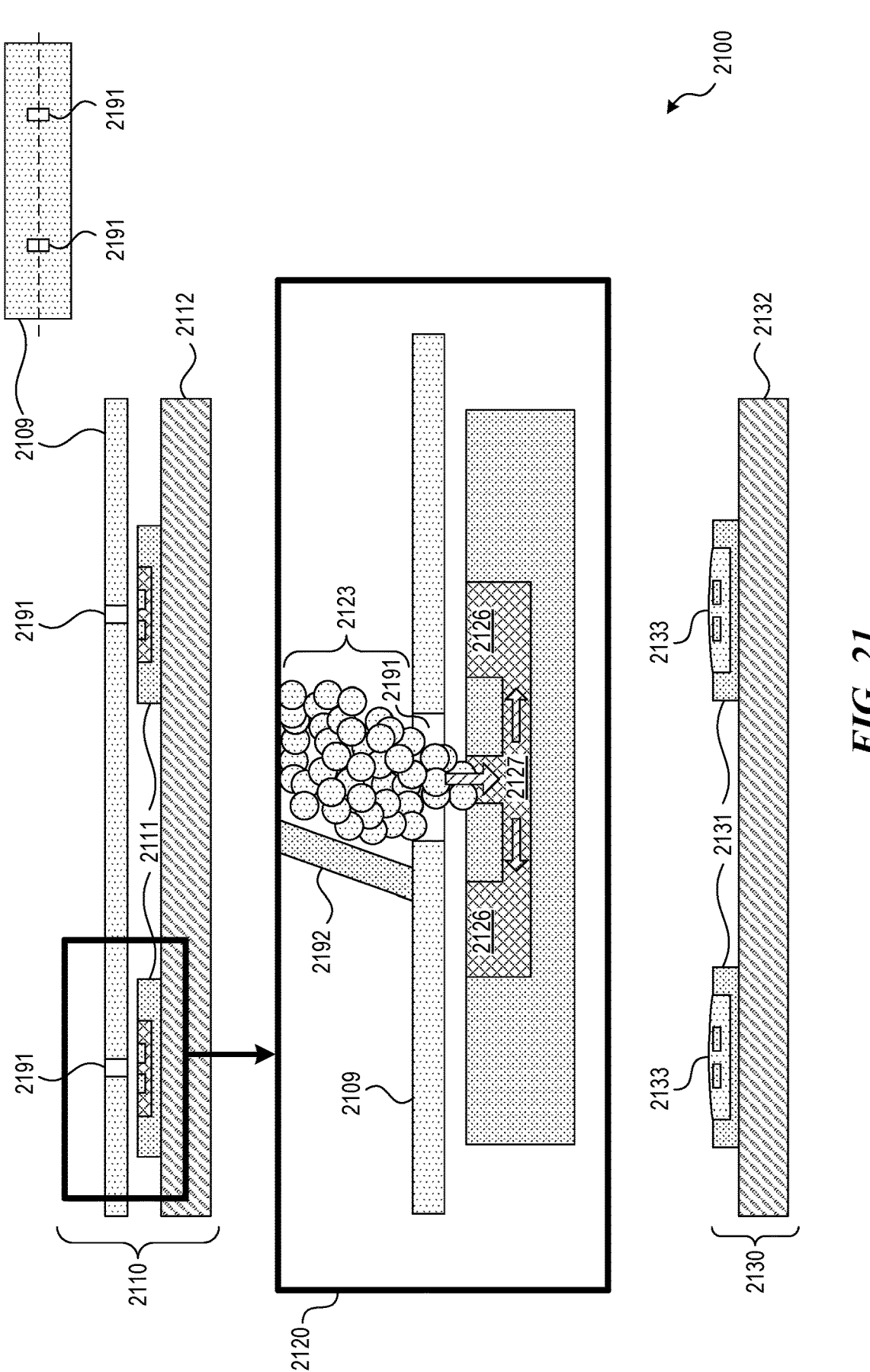
FIG. 21 shows a method of manufacturing a semiconductor device assembly with the part in accordance with embodiments of the present technology.

FIG. 21 shows a method for making the semiconductor device assembly, which includes the tunneled interconnect structure as a part. The method 2100 is decomposed into three steps. Step one 2110 is to align a stencil 2109 with an interconnect 2111 such that an aperture 2191 in the stencil 2109 matches up with a microvia in the interconnect 2111. Step two 2120 is to apply solder 2123 through a stencil aperture 2191 (e.g., by screen printing with a squeegee 2192) such that the solder fills a hollow interior 2127 of an interconnect 2111, as well as its microvias 2126. Step three 2130 is to remove the stencil 2109.

Figures 22, 23, 24:
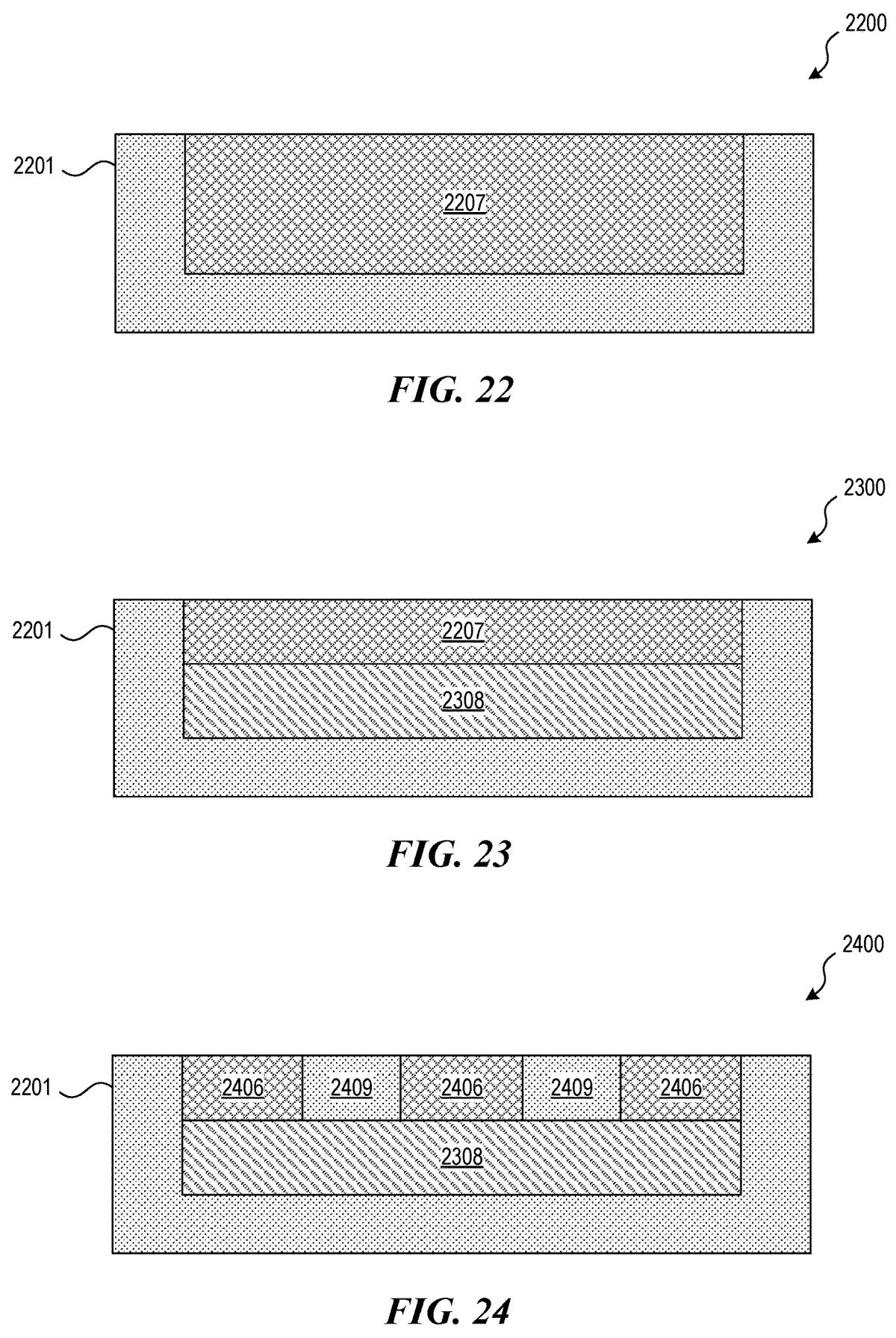

FIG. 22, FIG. 23, and FIG. 24 show a method for making a tunneled interconnect structure. First, a cavity 2207 is etched from a semiconductor interconnect 2201 (e.g., by drilling, with either a mechanical drill or laser, or by stripping, etching, etc.). This cavity 2207 is then filled with a temporary material 2308. It is important to note that the temporary material 2308 does not completely fill the cavity 2207, but rather leaves enough space for a series of bridges 2409 to be plated over (e.g., by electroless copper deposition, electroplating, etc.). This forms at least one microvia 2406, which will be included in the final tunneled interconnect structure and provide access to the interior cavity 2207 when the temporary material 2308 is removed.

In accordance with one aspect of the present disclosure, the semiconductor devices illustrated in the assemblies of FIGS. 5-20 could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 25:
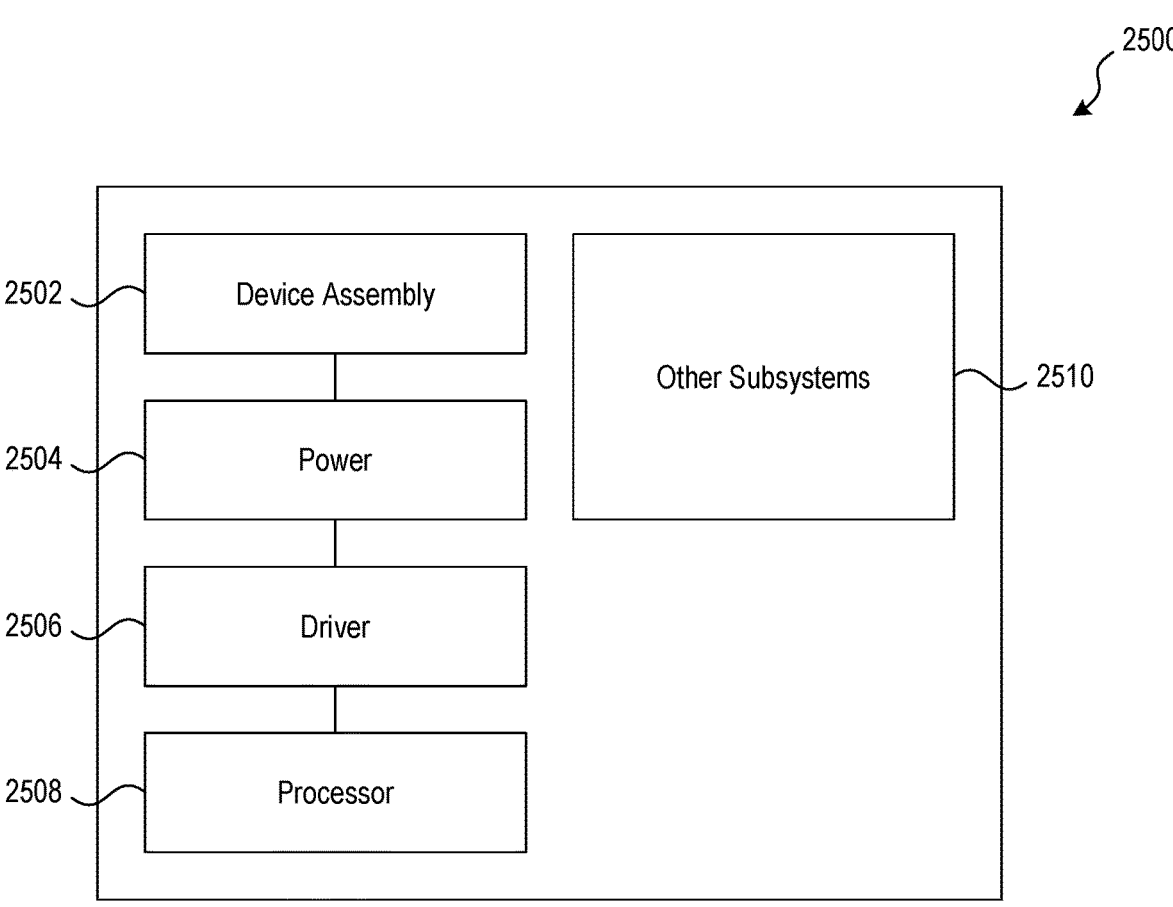
FIG. 25 is a schematic view showing a system that includes a semiconductor device assembly configured in accordance with an embodiment of the present technology.

Any one of the semiconductor devices and semiconductor device assemblies described above with reference to FIGS. 5-20 can be incorporated into any of a myriad of larger and/or more complex systems, a representative example of which is system 2500 shown schematically in FIG. 25. The system 2500 can include a semiconductor device assembly (e.g., or a discrete semiconductor device) 2502, a power source 2504, a driver 2506, a processor 2508, and/or other subsystems or components 2510. The semiconductor device assembly 2502 can include features generally similar to those of the semiconductor devices described above with reference to FIGS. 5-20. The resulting system 2500 can perform any of a wide variety of functions, such as memory storage, data processing, and/or other suitable functions. Accordingly, representative systems 2500 can include, without limitation, hand-held devices (e.g., mobile phones, tablets, digital readers, and digital audio players), computers, vehicles, appliances and other products. Components of the system 2500 may be housed in a single unit or distributed over multiple, interconnected units (e.g., through a communications network). The components of the system 2500 can also include remote devices and any of a wide variety of computer readable media.

Figure 26:
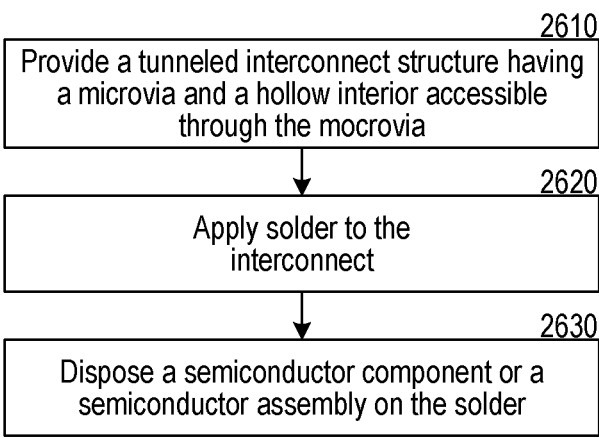
FIG. 26 is a flow chart illustrating a method of making a semiconductor device assembly in accordance with an embodiment of the present technology.

FIG. 26 is a flow chart illustrating a method of making a semiconductor device assembly. The method includes providing a tunneled semiconductor interconnect structure having microvias and a hollow interior accessible through the microvias (box 2610). The method further includes applying solder to the interconnect (box 2620). The method further includes disposing a semiconductor component or a semiconductor assembly on the solder (box 2630).

Figure 27:
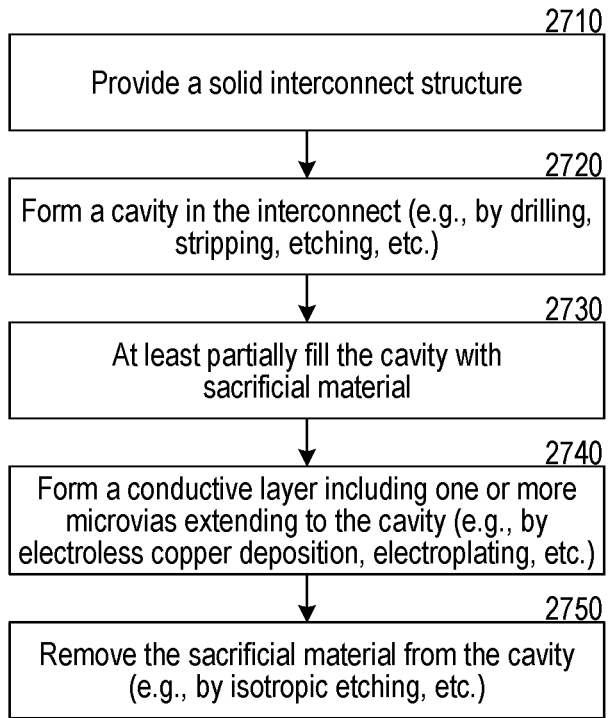
FIG. 27 is a flow chart illustrating a method of making a tunneled interconnect structure in accordance with an embodiment of the present technology.

FIG. 27 is a flow chart illustrating a method of making a tunneled interconnect structure. The method includes providing a solid interconnect structure (box 2710), followed by forming a cavity in the interconnect (e.g., by drilling, etching, etc.) (box 2720). This is followed by at least partially filling the cavity with a sacrificial material, (box 2730) and forming (box 2740) a conductive layer including one or more microvias extending to the cavity over the temporary material (e.g., by electroless copper deposition, electroplating, etc.). The method further includes removing (box 2750) the sacrificial material from the cavity (e.g., by isotropic etching).

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a package substrate including a tunneled interconnect structure, the tunneled interconnect structure having:
a solder-wettable surface, and
a concave surface extending below and overlapped by the solder-wettable surface,
wherein the solder-wettable surface includes at least one microvia defined by opposing side walls extending from the solder-wettable surface toward the concave surface;

a semiconductor device disposed over the package substrate; and
a solder joint coupling the semiconductor device and the package substrate, the solder joint including:
a first region of solder between the semiconductor device and the solder-wettable surface of the tunneled interconnect structure, wherein the first region of solder extends above the solder-wettable surface,
a second region of solder under the first region of solder and disposed in the at least one microvia, the second region directly contacting the opposing sidewalls, and
a third region of solder under the second region of solder and contacting a lowest portion of the concave surface.

2. The semiconductor device assembly of claim 1, wherein the tunneled interconnect structure is made of copper or some other metal alloy.

3. The semiconductor device assembly of claim 1, wherein the device includes a second tunneled interconnect structure, having:
a solder-wettable surface,
an interior cavity, and
at least one microvia extending from the solder-wettable surface to the interior cavity; and
the solder joint further includes:
a fourth region of solder disposed in the second tunneled interconnect structure's at least one microvia, and
a fifth region of solder in the second tunneled interconnect structure's interior cavity.

4. A substrate, comprising:
a body;
a tunneled interconnect structure directly contacting a top portion of the body, the tunneled interconnect structure including:
a solder-wettable surface,
a concave surface extending below and overlapped by the solder-wettable surface, and
at least one microvia defined by opposing side walls extending from the solder-wettable surface toward the concave surface, wherein the at least one microvia and the interior cavity define a continuous space configured to retain a remainder of the solder,
wherein the tunneled interconnect structure is configured to receive solder having (1) a first region coupling the tunneled interconnect to an external device, (2) a second region under the first region and contacting the opposing sidewalls, and (3) a third region under the second region and contacting a lowest portion of the concave surface.

5. The substrate of claim 4, wherein the at least one microvia includes a plurality of microvias having more than one size.

6. The substrate of claim 4, wherein a footprint encompasses the at least one microvia, and the footprint has a width measured across the solder-wettable surface between the furthest sides of the at least one microvia, and the hollow interior has a width measured along the same axis, and the width of the hollow interior is greater than the width of the footprint.

7. The substrate of claim 4, wherein the at least one microvia has a length measured according to its single longest side, and the hollow interior has a length measured along the same axis, and the length of the interior is greater than the length of the microvia.

8. The substrate of claim 5, wherein:

the plurality of microvias includes:

a smaller microvia in between two larger microvias.

9. The substrate of claim 5, wherein the plurality of microvias are aligned across the center of the interconnect.

10. The substrate of claim 5, wherein the plurality of microvias are laterally spaced apart from a centerline on the interconnect.

11. The substrate of claim 8, wherein the small microvia is positioned closer to a first side of the solder-wettable surface while the large microvias are positioned closer to a second side opposite the first side of the solder-wettable surface.

12. The substrate of claim 5, wherein the microvias are positioned along a diagonal line from one corner of the solder-wettable surface to an opposite corner.

\* \* \* \* \*